United States Patent
Broadwell

(10) Patent No.: US 8,213,883 B1
(45) Date of Patent: Jul. 3, 2012

(54) ADDITIVE PRE-DISTORTION FOR LINEARIZATION

(75) Inventor: Adric Quade Broadwell, San Francisco, CA (US)

(73) Assignee: Scintera Networks, Inc., Sunnyvale, CA (US)

( * ) Notice: Subject to any disclaimer, the term of this patent is extended or adjusted under 35 U.S.C. 154(b) by 994 days.

(21) Appl. No.: 12/190,781

(22) Filed: Aug. 13, 2008

Related U.S. Application Data

(60) Provisional application No. 60/992,227, filed on Dec. 4, 2007.

(51) Int. Cl.
 *H04B 1/04* (2006.01)
(52) U.S. Cl. ............... 455/114.3; 455/115.1; 455/127.3
(58) Field of Classification Search ............... 455/114.3, 455/115.1, 114.2, 127.3, 126; 330/2, 149; 375/295, 296, 297
See application file for complete search history.

(56) References Cited

U.S. PATENT DOCUMENTS

| | | | |
|---|---|---|---|
| 6,275,685 B1 * | 8/2001 | Wessel et al. | 455/126 |
| 6,429,736 B1 * | 8/2002 | Parry et al. | 330/2 |
| 6,711,217 B1 * | 3/2004 | Jeong | 375/297 |
| 6,922,104 B2 * | 7/2005 | Maniwa | 330/149 |
| 7,098,734 B2 * | 8/2006 | Hongo et al. | 330/149 |
| 7,268,620 B2 * | 9/2007 | Nygren et al. | 330/149 |
| 7,804,359 B1 * | 9/2010 | Cova | 330/149 |
| 8,121,560 B1 * | 2/2012 | Anaraki et al. | 455/114.3 |

* cited by examiner

*Primary Examiner* — Sonny Trinh
(74) *Attorney, Agent, or Firm* — Haynes and Boone, LLP

(57) ABSTRACT

In one embodiment, a signal processor for linearizing a non-linear circuit through pre-distortion of an input signal is provided that includes: a first coupler for extracting a version of the input signal, wherein a remaining portion of the input signal not extracted by the first coupler is provided to a first node; a mixer for multiplying the extracted version of the input signal with a pre-distortion signal to produce an additive signal, the pre-distortion signal having a relatively small or zero constant component such that the additive signal includes either no linear version of the input signal or a linear version of the input signal that has a lower power than the remaining portion of the input signal; and a second coupler to add the additive signal to the remaining portion of the input signal at the first node to form a pre-distorted input signal, whereby if the non-linear circuit processes the pre-distorted input signal to form an output signal, the output signal is a substantially linear function of the input signal.

17 Claims, 5 Drawing Sheets

US 8,213,883 B1

ADDITIVE PRE-DISTORTION FOR LINEARIZATION

RELATED APPLICATION

This application claims the benefit of U.S. Provisional Application No. 60/992,227 filed Dec. 4, 2007.

TECHNICAL FIELD

The present invention relates generally to signal processing, and more particularly to additive pre-distortion for linearizing non-linear circuits.

BACKGROUND

All amplifiers will have some non-linearity across their dynamic range. Although there are contexts in which the resulting distortion in the amplified signal is desirable (such as an electric guitar amplifier), most applications do not benefit from non-linear distortion. For example, modern wireless telecommunication protocols such as 2.5G and 3G use non-constant amplitude (envelope modulation) signals. These non-constant envelope signals are sensitive to non-linear-power-amplifier-induced distortion. Given the general desire for linear power amplification, a number of techniques have been developed to enhance the linearity of power amplifiers. For example, feedforward power amplifiers have good linearity but generally do not improve efficiency and greatly increase cost and complexity.

An attractive alternative to feedforward linearization techniques is to pre-distort the input signal in an inverse fashion with regard to the non-linearity of the power amplifier. This pre-distortion may be performed on the input signal in the digital domain prior to a digital-to-analog conversion. Alternatively, the input signal may be pre-distorted in the analog RF domain. To pre-distort the input signal in the RF domain, the input signal is typically multiplied with the pre-distortion signal. For example, an RF input signal that will be multiplied by the pre-distortion signal may be represented by the real part of $\{R(t)*\exp(j\omega_c t)\}$, where $R(t)$ is the complex envelope, j is the imaginary unit, $\omega_c$ is the angular frequency of the RF carrier bearing the complex envelop modulation, and t is time. The desired pre-distortion of the complex envelope may be better understood with reference to FIG. 1, which illustrates the non-linear dependence of an output signal amplitude 101 with respect to input signal amplitude for a conventional amplifier. As known in the arts, a conventional amplifier has a linear region of operation and a saturation region of operation (these regions being separated by dashed line 106 in FIG. 1). For relatively small input signal amplitudes, a real-world amplifier will amplify such small signal amplitudes into corresponding output signal amplitudes according to the gain of the amplifier in a close-to-perfectly-linear fashion. However, as the amplifier approaches saturation, output signal amplitude 101 progressively distorts away from an ideal linear response for the amplifier (the ideal linear response for a perfect amplifier being represented by dashed line 100). Given this non-linearity, it may be seen that if the input signal amplitudes to the amplifier were pre-distorted in a reciprocal fashion to the distortion seen in output signal amplitude 101 with respect to ideal response 100, the amplifier would provide an output signal that would mirror ideal response 100. As seen by an output signal amplitude 105 (which would be produced by an ideal amplifier amplifying the pre-distorted signal), the pre-distortion mirrors the distortion in output signal amplitude 101 with respect to ideal response 100. By multiplying such a pre-distortion signal with the input signal, the amplifier is thereby linearized, to the limit of saturation for the amplifier in question.

Referring back to the complex envelope representation of the RF input signal, it may be seen that the pre-distortion signal is a baseband signal in that the pre-distortion signal is a function of the complex envelope $R(t)$ and not of the RF carrier. In that regard, a pre-distortion signal that will be multiplied by the complex envelope may be represented as a Taylor series expression: $\alpha_1 + \alpha_2 * R(t) + \alpha_3 * R(t)^2 + \alpha_4 * R(t)^3 + \ldots$, where the alpha symbols represent complex series coefficients. Upon multiplication with the RF input signal (the real part of $\{R(t)*\exp(j\omega_c t)\}$), the resulting pre-distorted RF signal becomes the real part of $\{[\alpha_1 * R(t) + \alpha_2 * R(t)^2 + \alpha_3 * R(t)^3 + \alpha_4 * R(t)^4 + \ldots]*\exp(j\omega_c t)\}$ that will then form an input signal for the amplifier. The alpha coefficients are controlled so as to pre-distort the input signal so as to produce a linear response in the downstream amplifier.

Turning now to FIG. 2, an RF signal processing (RFSP) circuit 200 that addresses the non-linear distortion discussed with regard to FIG. 1 is illustrated. An amplifier 205 amplifies an RF input signal 201 (designated as the complex signal $(R(t)\exp(j\omega_c t))$) after it has been properly pre-distorted such that a resulting output signal 210 from the amplifier is amplified in a substantially linear fashion. To generate an appropriate pre distortion pre-distorted signal 265, the degree of non-linearity in this output signal should be determined so that the degree of pre-distortion necessary to linearize amplifier 205 may in turn be determined. The non-linearity of amplifier 205 may be determined in a number of fashions. For example, a version of output RF signal 210 may be suitably scaled in an attenuator 215 and have its sign reversed through a 180 degree phase-shifter 220 so that it may be subtracted from a version of the RF input signal in an adder 225 to produce an error signal e(t) 226. Each version of the RF input signal and the RF output signal is supplied through, for example, couplers 230. Based upon the non-linearity as exhibited in error signal 226, a signal generator 235 may then generate an appropriate pre-distortion signal 236 such as the complex Taylor series discussed above: $\alpha_1 + \alpha_2 * R(t) + \alpha_3 * R(t)^2 + \alpha_4 * R(t)^3$ and so on up until some final power of $R(t)$. This final power depends upon the complexity of the design and desired precision. For example, suppose the final power in the series expression is five, corresponding to $R(t)^5$. In such an embodiment, it may be seen that signal generator must then solve for six coefficients in the Taylor series, ranging from $\alpha_1$ to $\alpha_6$. The envelope function associated with each coefficient may be designated as the corresponding "basis" function. Thus the monomial basis function associated with coefficient $\alpha_1$ is $R(t)^0$, the basis function associated with coefficient $\alpha_2$ is $R(t)^1$, the basis function associated with coefficient $\alpha_3$ is $R(t)^2$, and so on. These coefficients may be determined in a variety of fashions. In an example analytical approach, signal generator 235 may include a correlator for each coefficient. Each coefficient's correlator correlates error signal 226 with the basis function corresponding to the coefficient. For example, coefficient $\alpha_2$ may be produced responsive to a correlation of the error signal and the envelope $R(t)$, coefficient $\alpha_3$ may be produced responsive to a correlation of the error signal and the squared envelope $R(t)^2$, and so on. It may be shown that the preceding selection of monomial basis functions will not typically provide desirable real-world results because numerous calculation cycles are necessary to converge to a solution. To enhance the convergence speed, each basis function may be an orthonormal polynomial formed from the above-discussed monomial powers of $R(t)$ such as discussed in U.S. application Ser. No. 11/484,008, filed Jul. 7, 2006, now U.S. Pat. No. 7,844,014, the contents of which are incorporated by reference. The correlation of the basis functions and the error functions may be performed in an analog domain or in a digital domain. In alternative embodiments, signal generator 235 may simply use a brute force approach or non-linear optimization techniques to select an appropriate value for the coefficients such that the error signal is minimized.

Regardless of how signal generator 235 processes the error signal, signal generator 235 will determine values for the coefficients in the series representation of pre-distorted RF input signal 265 as discussed above. The number of coefficients depends upon the highest power of the complex envelope R(t) that will be generated for pre-distorted RF input signal 265. For example, signal generator 235 may generate up to a sixth power of the complex envelope R(t) in a complex pre-distortion signal 236 represented as $(\alpha_1 + \alpha_2 * R(t)^1 + \alpha_3 * R(t)^2 + \alpha_4(t)^3 + \alpha_5 * R(t)^4 + \alpha_6 * R(t)^5 + \alpha_7 * R(t)^6)$. Depending upon the resulting non-linearity produced in output RF signal 210 for a given set of coefficients, the signal generator may then drive the coefficients (from $\alpha_1$ to $\alpha_7$) until the non-linearity reaches a minimal value.

In this fashion, signal generator 235 functions to cancel the non-linear components in RF output signal 210. For example, suppose the amplifier has a non-linearity such that it produces a component proportional to $R(t)^2$ having a certain phase relationship to the baseband envelope R(t). Signal generator 235 must then generate the coefficients such that this $R(t)^2$ component is cancelled in the RF output signal. It may thus be seen that each coefficient may require a unique and independent phase relationship to the baseband signal so that the corresponding non-linear component in the RF output signal may be cancelled. To enable such independent phasing, the multiplication of RF input signal 201 and pre-distortion signal 236 should be performed in the in-phase (I) and quadrature (Q) domain. Thus, the RF input signal R(t) may be decomposed into its I and Q components after passing through a buffer 240 and a quadrature phase-shifter (QPS) 245. Signal generator 235 generates its coefficients in corresponding I and Q forms (designated in FIG. 2 as the real (Re) and imaginary (Im) parts of pre-distortion signal 236, respectively). The resulting I components of the RF input signal and the pre-distortion signal are multiplied in a mixer 250. Similarly, the resulting Q components of the RF input signal and the pre-distortion signal are multiplied in a mixer 255. The mixer output signals may be combined in a combiner 260 to provide pre-distorted RF input signal 265 to the amplifier.

But note that the generation of the analog non-linear components $R(t)^2$, $R(t)^3$, etc., in the signal generator is an inherently noisy process. The noise in the pre-distortion signal may then dominate the resulting pre-distorted RF input signal 265 that is to be amplified as shown by the following analysis: Let the input signal to be pre-distorted be represented by X such that its signal-power-to-noise-power ratio ($SNR_X$) is $X^2/(nx)^2$, where nx represents the rms noise "n" in the input signal X. Similarly, the pre-distortion signal may be represented by Y such that its signal-power-to-noise-power ratio ($SNR_Y$) is $Y^2/(ny)^2$. The multiplied signal (corresponding to pre-distorted RF input signal 265) is thus represented by Y*X. It may then be shown that the SNR for the signal YX is $1/((1/SNR_X)+(1/SNR_Y))$. This expression for output SNR indicates that the output SNR is lower than the lowest SNR of the two inputs. This is a worst case scenario for the output SNR because the pre-distortion signal Y is typically noisy as compared to the input signal X. For example, suppose $SNR_X$ is 100,000 and $SNR_Y$ is 10,000 such that the RF input signal X is 10 times less noisy than the pre-distortion signal Y. However, the output SNR will be 9,091, slightly less than the pre-distortion signal's $SNR_Y$ because of its SNR dependence discussed above.

Because pre-distortion in the RF domain is noisy, linearization using pre-distortion is typically performed in the digital domain. However, digital pre-distortion has its own problems because of the sampling noise introduced by the required conversions of the pre-distortion signal into the digital domain and then back into the analog domain. Moreover, these conversions use large amounts of power (often as much as a low-power power amplifier) and require complex circuitry. Accordingly, there is a need in the art for more robust pre-distortion techniques.

SUMMARY

Disclosed embodiments exploit the weakly non-linear nature of non-linear circuits such as power amplifiers. In other words, amplifiers are designed to be predominately linear such that a linear portion of an amplifier output signal is more powerful than a non-linear portion of the output signal. Appropriate pre-distortion of an amplifier input signal will thus mirror this imbalance between linearity and non-linearity—the linear portion in the pre-distorted amplifier input signal is more powerful than the non-linear portion. Although the non-linear portion of the pre-distorted input signal is relatively weak, it is inherently noisier than the linear portion. To prevent the domination of the signal-to-noise ratio in the pre-distorted input signal by the noisy non-linear components, the non-linear components in the pre-distorted input signal are formed separately from the linear term such that the pre-distorted input signal is formed by the addition of the non-linear and linear terms. This additive pre-distortion is very advantageous because the signal-to-noise ratio in the pre-distorted input signal is not polluted by the relatively noisy nature of the non-linear terms.

To separate the linear and non-linear formation of the pre-distorted input signal, the non-linear signal portion of the pre-distorted input signal may be formed at a mixer from a version of the input signal and a pre-distorting signal. A first coupler may be used to extract the version of the input signal provided to the mixer such that the input signal is divided into a remaining input signal portion and the extracted version. A second coupler may be used to add the non-linear signal portion from the mixer with the remaining input signal portion to form the pre-distorted input signal. A variable gain amplifier may be used to amplify the remaining input signal portion prior to addition with the non-linear signal portion.

A method to separately form the linear and non-linear portions of the pre-distorted input signal comprises: multiplying a version of the input signal with a pre-distortion signal to produce a multiplied signal, the pre-distortion signal having no constant component such that the multiplication produces no linear versions of the input signal; adding the multiplied signal to the input signal to provide a pre-distorted input signal; and processing the pre-distorted input signal through the non-linear circuit to provide an output signal that is a substantially linear function of the input signal.

The invention will be more fully understood upon consideration of the following detailed description, taken together with the accompanying drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 1:
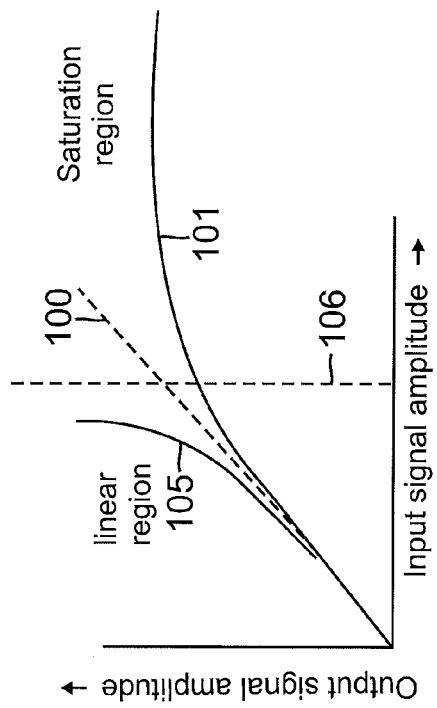
FIG. 1 illustrates the non-linear properties of a conventional power amplifier.
Figure 2:
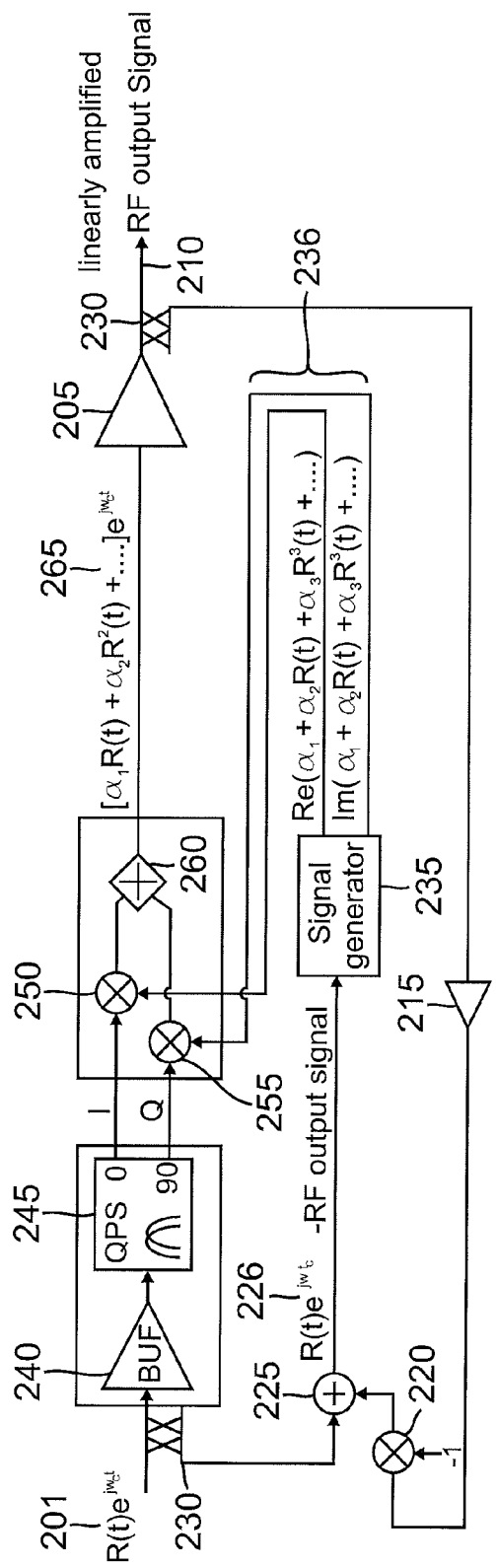
FIG. 2 illustrates an RF signal processing circuit that pre-distorts an input signal to a non-linear circuit component such as an amplifier such that the non-linear circuit produces an output signal that is linearly related to the input signal.
Figure 3:
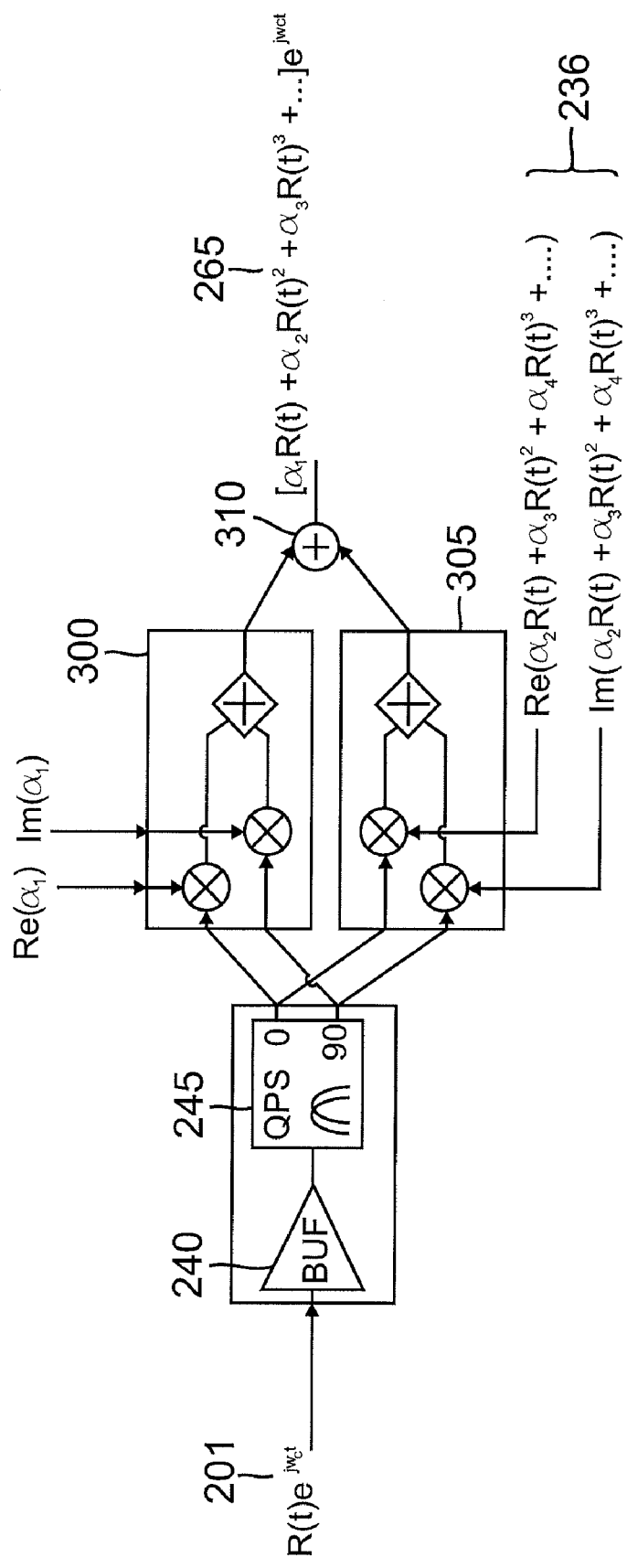
FIG. 3 illustrates an improvement of the RF signal processing circuit of FIG. 2 wherein the non-linear portion of the pre-distorted RF input signal provided to the amplifier is produced in a different path as compared to the production of the linear portion of the pre-distorted RF input signal.

The following pre-distortion linearization techniques exploit certain characteristics of the pre-distorted input signal that is processed through a non-linear circuit such as an amplifier. As discussed above, the pre-distorted input signal represents an inversion of the non-linearity introduced by the non-linear circuit. Examination of FIG. 1 shows that the linear component in the desired pre-distorted RF input signal will dominate over the non-linear components when the non-linearity is merely moderately non-linear. Turning now to FIG. 3, this domination of the linear component may be exploited by providing parallel paths for the I and Q signal from QPS 245. A pair of I and Q mixers plus a combiner analogous to mixers 250 and 255 and combiner 260 discussed with regard to FIG. 2 are provided in each path. A first pair of mixers and a corresponding combiner 300 mix only the I and Q components for the DC coefficient in pre-distorted signal 236 (generated as discussed with regard to FIG. 2—for illustration clarity, the circuitry to generate signal 236 is not shown in FIG. 3) with I and Q components of the RF input signal. The output from mixers and combiner 300 is thus the linear term in the pre-distorted signal (a scaled and phase-shifted version of an RF input signal 201). Similarly, a second pair of mixers and a corresponding combiner 305 mix the remaining I (Re) and Q (Im) components for the pre-distortion signal with corresponding I and Q components of the RF input signal. Thus, the second pair of mixers 305 do not mix any DC portion of pre-distortion signal 236 with the I and Q components such that an output signal from mixers and combiner 305 contains only non-linear versions (powers) of the complex envelope R(t). The output signals from the respective combiners 300 and 305 are combined in a combiner 310 to produce pre-distorted RF input signal 265. For illustration clarity, related components discussed with regard to FIG. 2 such as signal generator 235 are not shown in FIG. 3. Note the improvement with regard to FIG. 2—the production of the noisy (and low-power) non-linear components $\alpha_2 *R(t)^2 + \alpha_3 *R(t)^3 + \alpha_4 *R(t)^4 + \ldots$ in the envelope for pre-distorted RF input signal 265 is decoupled from the production of the relatively less noisy (and higher power) linear term $\alpha_1 *R(t)$. As will be explained further herein, this decoupling provides a significant improvement in the signal-to-noise-ratio (SNR) for pre-distorted RF input signal 265 and hence for the SNR in an output signal resulting from the amplification of pre-distorted RF input signal 265. It will be appreciated that any real-world signal generator such as signal generator 235 of FIG. 2 cannot produce an infinite series of powers of the complex envelope. In other words, the series must end at some finite power. For example, it is believed that generating a series ending at the sixth power of R(t) (such that the output of combiner 305 may include a seventh power of R(t)) is sufficient to substantially linearize a power amplifier such as those used in cellular base stations. It will be appreciated that is some embodiments, a linear component may be present in pre-distortion signal 236 in that some signal-to-noise ratio (SNR) improvement will be realized in the downstream amplifier so long as the DC component of pre-distortion signal 236 is of lower power than the power in the remaining portion of the signal.

Figure 4:
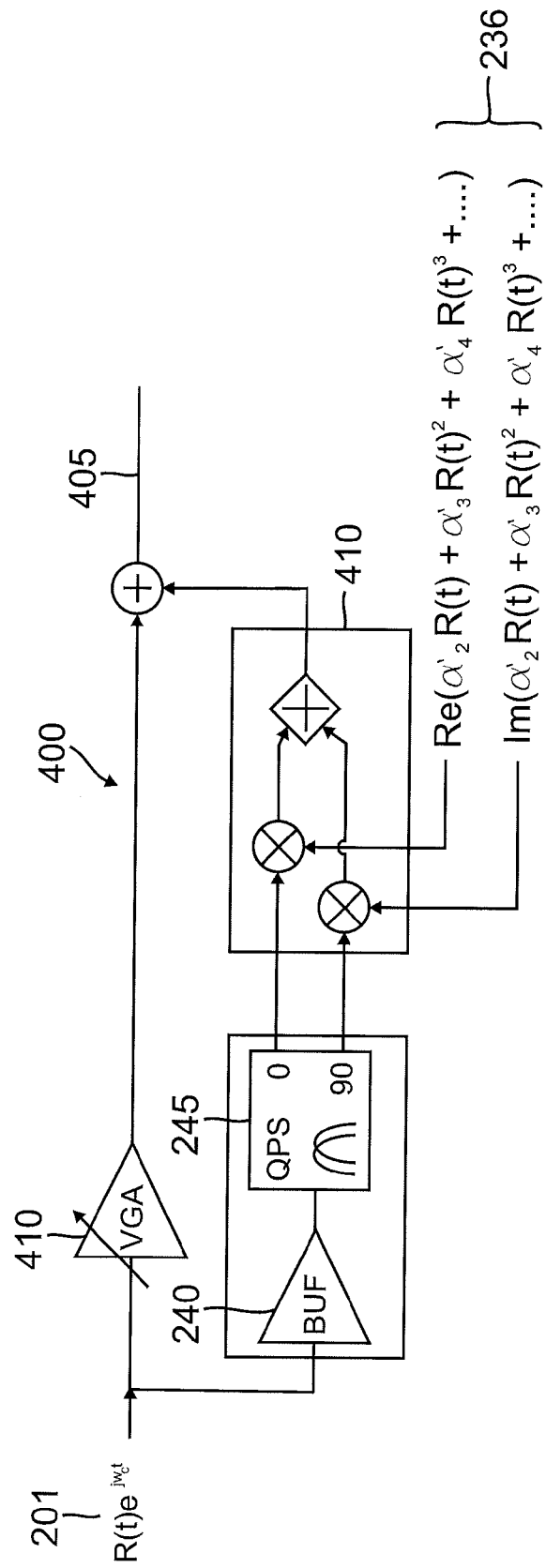
FIG. 4 illustrates an improvement of the RF signal processing circuit of FIG. 3 such that no mixers are required in the signal path that produces the linear term in the pre-distorted RF input signal.

Turning now to FIG. 4, dramatic improvements in dynamic range may also be achieved through an appropriate decoupling in the production of the linear and non-linear terms in the pre-distorted RF input signal in an RF signal processing (RFSP) circuit 400. In circuit 400, the linear term in a pre-distorted RF input signal 405 is produced by an appropriate attenuation (or amplification) of the RF input signal in a variable amplifier 410. Because there is no I/Q channel formation with regard to the linear term, it may be seen that this linear term cannot be phased according to the complex value of the corresponding coefficient $\alpha_1$ (assuming that the signal generator, which is not shown for illustration clarity but corresponds to generator 235 of FIG. 1, determines that $\alpha_1$ should be complex). The remaining non-linear terms in the pre-distorted RF input signal are generated analogously as discussed with regard to FIG. 3 using a buffer 240, QPS 245, and I/Q mixers and combiner circuit 410. But note that the I portion (real portion) of the pre-distortion signal that mixes with the corresponding I portion of the RF input signal and also the Q portion of the pre-distortion signal that mixes with the corresponding Q portion of the RF input signal are not necessarily the same as discussed with regard to FIG. 3. This is because the I and Q portions of the pre-distortion signal may need to be re-phased since the linear portion of the pre-distorted RF input signal has been produced without an I/Q mixing. In other words, the phase relationship between $\alpha_1 *R(t)$ and the remaining non-linear terms may change because the linear envelope term is no longer re-phased as it would be if it were multiplied by a complex coefficient $\alpha_1$ in an I/Q fashion. To account for this phase relationship loss, the I and Q portions of the pre-distortion signal may be re-phased according to coefficients that may differ from those discussed with regard to FIG. 3. Thus, the in-phase portion I and the quadrature-phase portion Q of the pre-distortion signal are denoted as the real and imaginary parts of $[\alpha_2'*R(t)^2 \alpha_3'* R(t)^3 + \alpha_4'*R(t)^4 + \ldots]$, respectively, where the alpha coefficients are given a prime signal to signify that these coefficients may differ from those discussed earlier. Note the advantages of RFSP 400 over the corresponding RFSP discussed with regard to FIG. 3. While RFSP 400 enjoys the same SNR decoupling from the noisy non-linear term formation, it also has a much wider dynamic range because the I and Q signals from QPS 245 of FIG. 3 must be mixed to produce both the linear term and the non-linear terms in the resulting pre-distorted RF input signal. The linear term is considerably larger such that the dynamic range in the mixers in circuit 305 will be wasted. In contrast, the I and Q signals from QPS 245 in RFSP 400 are mixed to just provide the non-linear terms in the pre-distorted RF input signal. The mixers in circuit 410 may then be configured to use their full dynamic ranges whereas the mixers in circuit 305 cannot be so configured.

In addition to these dynamic range improvements, RFSP 400 is also less costly to build because a set of mixers has been eliminated. The linear signal integrity has also been improved due to the signal no longer being passed through the QPS, which can be quite noisy and lossy. Indeed, further circuit simplification may be achieved as seen with regard to an RFSP 500 of FIG. 5. In RFSP 500, the linear envelope term in the pre-distorted RF input signal 265 is not attenuated or amplified according to any coefficients. As discussed with regard to FIG. 4, the corresponding coefficients in the pre-distortion signal must then be altered from those discussed with regard to FIG. 3. For example, analysis of the RF output signal from a circuit such as amplifier 205 of FIG. 2 by a signal generator may indicate that a non-linearity may be cured by pre-distorting the complex envelope R(t) of the RF input signal to the amplifier such that the complex envelope becomes $[\alpha_1*R(t)+\alpha_2*R(t)^2+\alpha_3*R(t)^3+\alpha_4*R(t)^4+\ldots]$ as discussed previously. In such a pre-distorted signal, the linear term has a certain phase relationship to the quadratic term, a certain phase relationship to the cubed term, and so on. If the linear term is then changed to just R(t), it may be seen that these phase relationships are disturbed. But the remaining coefficients may adjust their phase such that the overall phase difference between the linear term and the remaining non-linear terms is maintained the same as in the original pre-distorted RF input signal. Because such a preservation of phase relationships may require different coefficients than those discussed with regard to FIG. 4 (unless the variable amplifier of FIG. 4 was implementing a unity gain and had zero delay), the in-phase and quadrature portions of the pre-distortion signal may be designated as the real and imaginary parts, respectively, of $[\alpha_2''*R(t)^2+\alpha_3'''*R(t)^3+\alpha_4''*R(t)^4+\ldots]$, where the double prime signal for the alpha coefficients is used to signify that these coefficients may differ from those discussed earlier. RFSP 500 includes a coupler 505 to provide a version of the RF input signal to buffer 240 and QPS 245. In this embodiment, buffer 240 and QPS 245 are configured to process double-ended signals (for illustration clarity, these components are illustrated in a single-ended configuration) such that a transformer 510 may be used to transform the RF input signal into a differential (double-ended) signal. A circuit 515 functions analogously to circuit 410 of FIG. 4 to mix the I and Q portions of the RF input signal version obtained from transformer 510 with the corresponding in-phase and quadrature portions of the pre-distortion signal (for illustration clarity, circuit 515 is also illustrated in a single-ended configuration). The resulting pre-distorted signal is transformed back into a single-ended form in a transformer 520 so it can couple with the RF input signal at a coupler 525 to form pre-distorted RF input signal 265.

Figure 5:
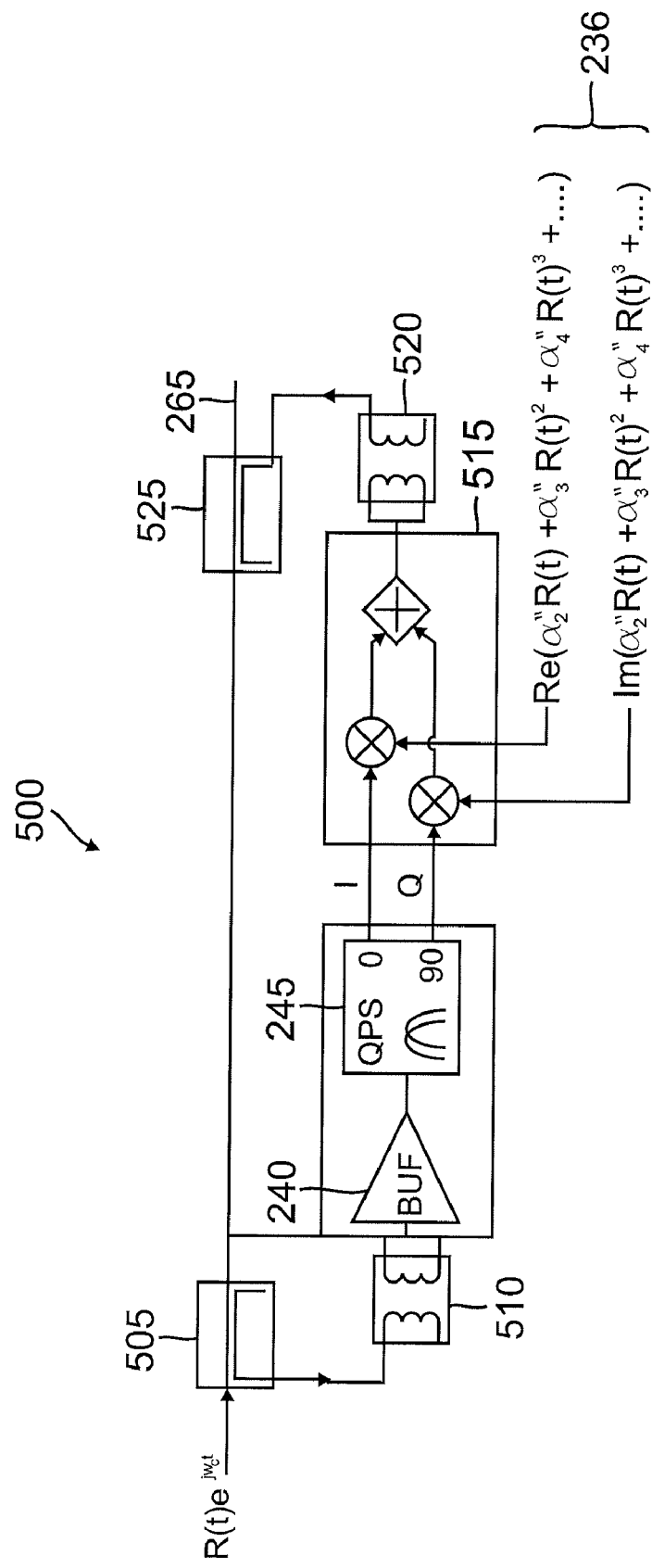
FIG. 5 illustrates a further improvement to the RF signal processing (RFSP) circuit of FIG. 3 such that no signal modification need be performed on the RF input signal to form the linear term in the pre-distorted RF input signal.

Regardless of whether an RFSP enjoys the simplicity and enhanced dynamic range discussed with regard to FIGS. 4 and 5, so long as the formation of the non-linear terms in the pre-distorted RF input signal is decoupled from the formation of the corresponding linear term, the resulting RFSP will advantageously not suffer from a reduction in SNR due to noise from the non-linear term formation as discussed with regard to FIG. 1.

Figure 6:
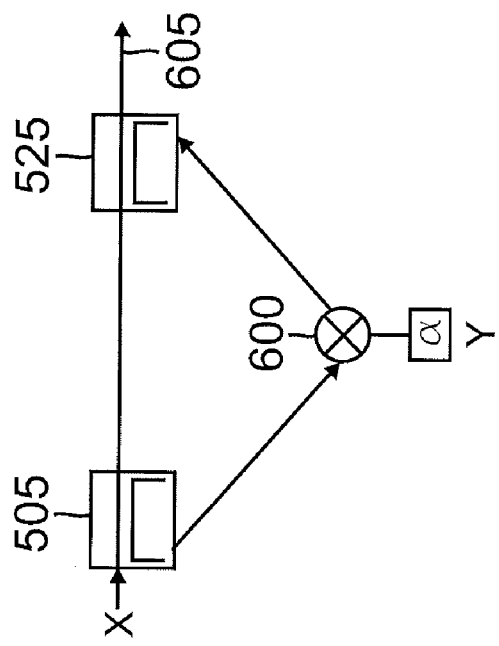
FIG. 6 is a simplified representation of the RFSP of FIG. 5.

Turning now to FIG. 6, a simplified representation of RFSP 500 is illustrated. However, the ensuing SNR analysis will apply to any implementation in which the non-linear term formation is decoupled from the linear term formation. The RF input signal is represented by signal X having an SNR designated as $SNR_X$. Similarly, the powers of the RF input signal's envelope R(t) are represented by signal Y having an SNR designated as $SNR_Y$. The coefficients that scale signal Y (representing the scaling of the powers of R(t)) are represented by a scaling factor $\alpha$. Couplers 505 and 525 each introduce an attenuation modeled by a coefficient $\beta$. Thus, a version of the input signal X is scaled by an attenuation $\beta$, multiplied with the pre-distortion signal $\alpha Y$ in a multiplier 600 and coupled back with the input signal X to form a pre-distorted signal 605 that equals X (minus the $\beta X$ extracted by coupler 505)+$\alpha\beta^2 XY$. It can be shown that an output SNR ($SNR_{out}$) for pre-distorted signal 605 equals $$SNR_{out} = \frac{1}{\frac{(\alpha\beta^2)^2 Y^2}{SNR_Y} + \frac{(\alpha\beta^2 Y)^2}{SNR_X} + \frac{1}{SNR_X}} + \frac{1}{\frac{1}{SNR_Y} + \frac{1}{SNR_X} + \frac{1}{SNR_X*(\alpha\beta^2)^2 Y^2}}.$$

It may thus be observed that the second term in this expression will be dominated by the noise in the Y signal such as is the case for the output signal for RFSP 200 of FIG. 2. However, the entire second term is dominated by the first term where the effect of $SNR_Y$ is tempered by the $(\alpha\beta^2)^2 Y^2$ factor. Thus, the output SNR is substantially equal to $SNR_X$ rather than being dominated by $SNR_Y$ (assuming that $SNR_Y$ is lower than $SNR_X$ and further assuming that the predistortion term, $(\alpha\beta^2)^2 Y^2$, that is added is lower power than the original linear team, as is the case for a weakly non-linear system).

Figure 7:
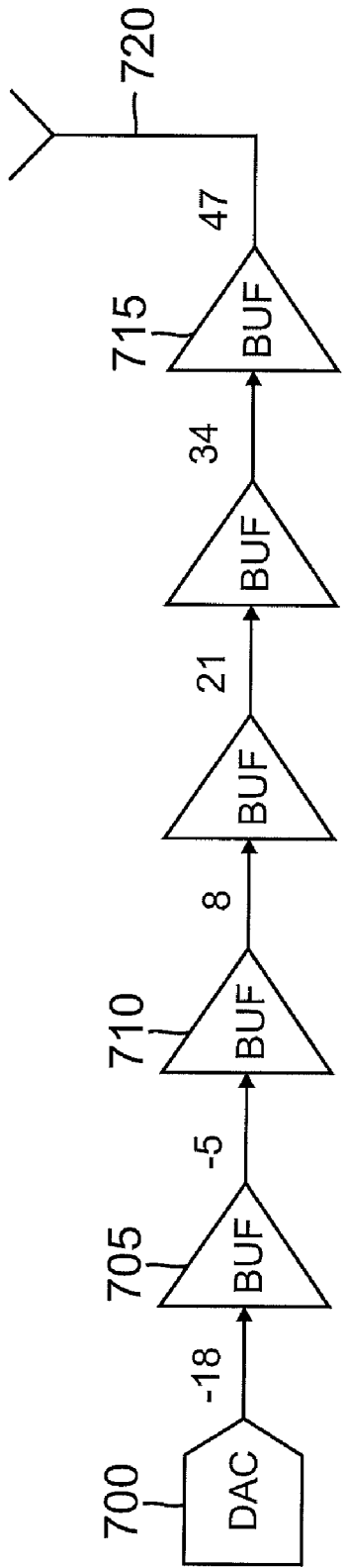
FIG. 7 illustrates an amplifier serial cascade that may be linearized by the RFSP of FIG. 5.

Referring again to FIG. 5, it may be seen that RFSP 500 offers numerous advantages over RFSP 200 of FIG. 2. For example, consider the serial cascade of amplifiers shown in FIG. 7, which is representative of a typical amplifier train for power amplification, for example, in cellular base stations. A digital-to-analog converter 700 receives a digital signal so as to produce an analog RF input signal. This RF input signal is then amplified across the serial cascade of amplifiers such that each amplifier in the cascade produces a successively more powerful output signal. For example, a first amplifier 705 produces a −18 dBm output signal, a second amplifier 710 amplifies this output signal into a −5 dbm output signal, and so on until a final amplifier 715 produces a 47 dBm output signal that may be transmitted through an antenna 720. Should RFSP 200 of FIG. 2 form an integrated circuit produced using conventional CMOS processes, the maximum signal power that may be processed may be no higher than −5 dBm, depending upon the particular CMOS process used. Thus, RFSP 200 could be inserted in this amplifier cascade (or chain) no higher than an output terminal of amplifier 705. However, because RFSP 500 perfoims its pre-distortion in an additive fashion (rather than a multiplicative fashion as for RFSP 200) and because the system need only inject a relatively small pre-distortion signal due to the system being weakly nonlinear, RFSP may inject its pre-distortion signal in multiple locations in the cascade of FIG. 7. For example, if it is assumed that coupler 505 introduces −20 dBm of loss and RFSP 500 can process no more than a −5 dBm signal, RFSP 500 could be inserted after any amplifier whose output does not exceed 15 dbM (amplifier 710 or 705).

It will be obvious to those skilled in the art that various changes and modifications may be made without departing from this invention in its broader aspects. For example, although the linearization techniques and circuits discussed above have used an amplifier as the non-linear circuit to linearized, it will be appreciated that the resulting linearization advantages may be enjoyed by any non-linear circuit one wishes to linearize. For example, mixers and phase-shifters may be linearized by the techniques and circuits disclosed herein. The appended claims encompass all such changes and modifications as fall within the true spirit and scope of this invention.

I claim:

1. A signal processor for linearizing a non-linear circuit through pre-distortion of an input signal to form a pre-distorted input signal, the non-linear circuit processing the pre-distorted input signal to provide an output signal, comprising:
    a first coupler for extracting a version of the input signal, wherein a remaining portion of the input signal not extracted by the first coupler is provided to a first node;
    a mixer for multiplying the version of the input signal with a pre-distortion signal to produce an additive signal, the pre-distortion signal having a relatively small or zero constant component such that the additive signal includes either no linear version of the input signal or a linear version of the input signal that has a lower power than the remaining portion of the input signal; and
    a second coupler to add the additive signal to the remaining version of the input signal at the first node to form the pre-distorted input signal, whereby the output signal is substantially linearly related to the input signal.

2. The signal processor of claim 1, further comprising:
    a quadrature phase-shifter (QPS) to form an in-phase portion of the version of the input signal and a quadrature portion of the version of the input signal, wherein the mixer comprises an in-phase mixer for mixing the in-phase portion with an in-phase version of the pre-distortion signal to provide an in-phase output signal and a quadrature-phase mixer for mixing the quadrature-phase portion with a quadrature-phase version of the pre-distortion signal to provide a quadrature-phase output signal, and
    a combiner for combining the in-phase and quadrature-phase output signals to form the additive signal.

3. The signal processor of claim 2, further comprising a buffer to buffer the version of the input signal provided to the QPS.

4. The signal processor of claim 1, wherein the non-linear circuit is an amplifier.

5. The signal processor of claim 1, wherein the non-linear circuit is a mixer.

6. The signal processor of claim 1, further comprising a signal generator, the signal generator being adapted to receive a version of the output signal from the non-linear circuit and a version of the input signal so that the signal generator may determine the non-linearity of the non-linear circuit, the signal generator being further adapted to generate the pre-distortion signal so that the non-linearity is substantially eliminated.

7. The signal processor of claim 1, further comprising:
    means for forming an in-phase portion of the version of the input signal and a quadrature portion of the version of the input signal, wherein the mixer comprises an in-phase mixer for mixing the in-phase portion with an in-phase version of the pre-distortion signal to provide an in-phase output signal and a quadrature-phase mixer for mixing the quadrature-phase portion with a quadrature-phase version of the pre-distortion signal to provide a quadrature-phase output signal, and
    a combiner for combining the in-phase and quadrature-phase output signals to form the additive signal.

8. The signal processor of claim 7, wherein the non-linear circuit is an amplifier.

9. The signal processor of claim 7, wherein the non-linear circuit is a mixer.

10. The signal processor of claim 7, further comprising a signal generator, the signal generator being adapted to receive a version of the output signal from the non-linear circuit and a version of the input signal so that the signal generator may determine the non-linearity of the non-linear circuit, the signal generator being further adapted to generate the pre-distortion signal so that the non-linearity is substantially eliminated.

11. A signal processor for linearizing a non-linear circuit through pre-distortion of an input signal, comprising:
    a first coupler for extracting a version of the input signal;
    a variable gain amplifier adapted to receive a remaining portion of input signal not extracted by the first coupler to provide a gain-adjusted version of the input signal;
    a mixer for mixing the version of the input signal from the first coupler with a pre-distortion signal to produce an additive signal, the pre-distortion signal having a relatively small or zero constant component such that the additive signal includes either no linear version of the input signal or a linear version of the input signal that has a lower power than the remaining portion of the input signal; and
    a second coupler to add the additive signal to the gain-adjusted version of the input signal to form a pre-distorted input signal, whereby if the non-linear circuit processes the pre-distorted input signal to form an output signal, the output signal is a substantially linear function of the input signal.

12. A method of linearizing a non-linear circuit, comprising:
    generating an error signal based upon a non-linearity in an output signal from the non-linear circuit;
    generating a pre-distortion signal responsive to the error signal;
    multiplying a version of the input signal with the pre-distortion signal to produce a multiplied signal, the pre-distortion signal having no constant component such that the multiplication produces no linear versions of the input signal;
    adding the multiplied signal to the input signal to provide a pre-distorted input signal; and processing the pre-distorted input signal through the non-linear circuit to provide the output signal that is a substantially linear function of the input signal.

13. The method of claim 12, wherein the non-linear circuit is an amplifier, the output signal thereby being a substantially linearly amplified version of the input signal.

14. The method of claim 13, wherein the amplifier comprises a cascade of a plurality of amplifiers arranged from a first amplifier to a last amplifier such that each successive amplifier amplifies an output signal from an immediately-preceding amplifier.

15. The method of claim 14, wherein the cascade of a plurality of amplifiers forms a power amplifier for a cellular base station.

16. The method of claim 12, wherein the non-linear circuit is a mixer, the output signal thereby being a substantially linearly multiplied version of the input signal.

17. The method of claim 12, wherein the input signal includes an envelope modulation, the pre-distortion signal being a series expression of various powers of the envelope modulation.

* * * * *